(12) United States Patent
Xia et al.

(10) Patent No.: US 6,261,975 B1
(45) Date of Patent: Jul. 17, 2001

(54) METHOD FOR DEPOSITING AND PLANARIZING FLUORINATED BPSG FILMS

(75) Inventors: Li-Qun Xia, San Jose; Francimar Campana, Milpitas; Ellie Yieh, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/262,782

(22) Filed: Mar. 4, 1999

(51) Int. Cl.⁷ .......................... H01L 21/31; H01L 21/469
(52) U.S. Cl. .......................... 438/783; 438/784; 438/787; 438/763
(58) Field of Search .................... 438/783, 784, 438/788, 787, 763, 760

(56) References Cited

U.S. PATENT DOCUMENTS

| | | | |
|---|---|---|---|
| 4,791,005 | 12/1988 | Becker et al. | 427/255 |
| 4,845,054 | 7/1989 | Mitchener | 437/238 |
| 5,094,984 | 3/1992 | Liu et al. | 437/235 |
| 5,104,482 | 4/1992 | Monkowski et al. | 156/643 |
| 5,155,336 | 10/1992 | Gronet et al. | 219/411 |
| 5,180,692 | 1/1993 | Ibuka et al. | 437/240 |
| 5,286,681 | 2/1994 | Maeda et al. | 437/240 |
| 5,354,387 | 10/1994 | Lee et al. | 148/33.3 |
| 5,629,246 * | 5/1997 | Iyer | 438/763 |
| 5,633,211 * | 5/1997 | Imai et al. | 438/760 |
| 5,827,778 * | 10/1998 | Yamada | 438/637 |
| 5,827,785 * | 10/1998 | Bhan et al. | 438/784 |
| 6,057,250 * | 5/2000 | Kirchoff et al. | 438/784 |

FOREIGN PATENT DOCUMENTS 0 562 625 B1   6/1997 (EP) .......................... H01L/21/316

OTHER PUBLICATIONS

U.S. application No. 08/748,884, Xia et al., filed Nov. 13, 1996.
U.S. application No. 09/076,170, Xia et al., filed May 5, 1998.
U.S. application No. 09/199,911, Xial et al., filed Nov. 25, 1998.

* cited by examiner

Primary Examiner—John F. Niebling
Assistant Examiner—Walter L. Lindsay, Jr.
(74) Attorney, Agent, or Firm—Townsend and Townsend and Crew

(57) ABSTRACT

A method for improving the reflow characteristics of a BPSG film. According to the method, a fluorine- or other halogen-doped BPSG layer is deposited over a substrate and reflowed using a rapid thermal pulse (RTP) method. The use of such an RTP reflow method results in superior reflow characteristics as compared to a 20–40 minute conventional furnace reflow process. The inventors discovered that reflowing FBPSG films in a conventional furnace may result in the highly mobile fluorine atoms diffusing from the film prior to completion of the anneal. Thus, the FBPSG layer loses the improved reflow characteristics provided by the incorporation of fluorine into the film. The RTP reflow reflows the film in a minimal amount of time (e.g., 10–90 seconds depending on the temperature used to reflow the layer and the degree of planarization required among other factors). Thus, the fluorine atoms within the FBPSG layer do not have sufficient time to migrate from the layer even if the layer is deposited over a PETEOS oxide or similar layer.

18 Claims, 4 Drawing Sheets

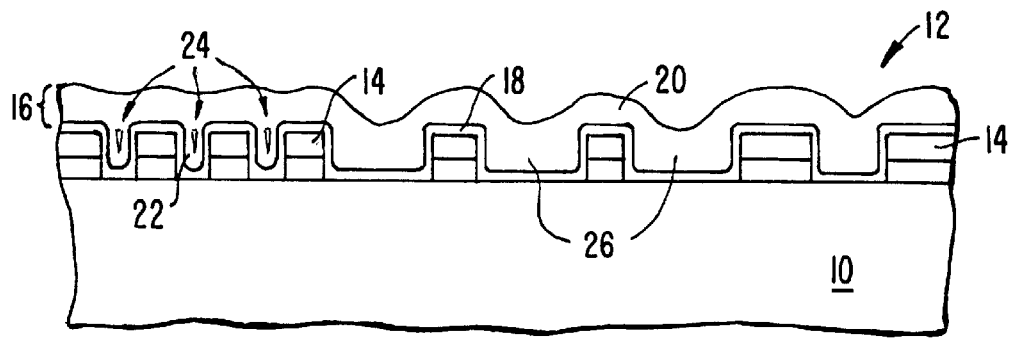
FIG. 1A.
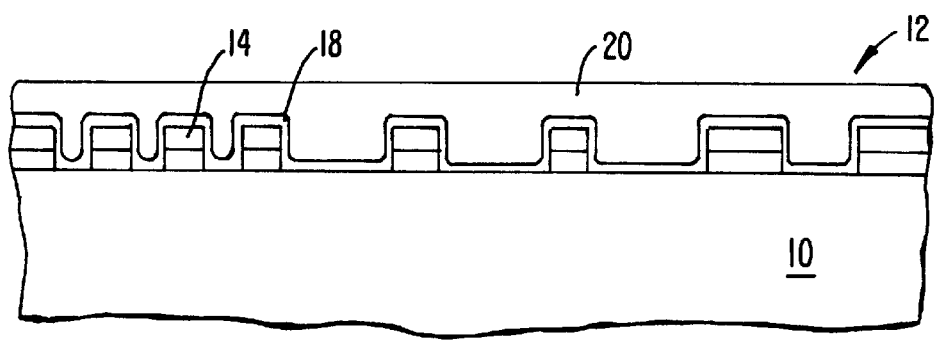
FIG. 1B.
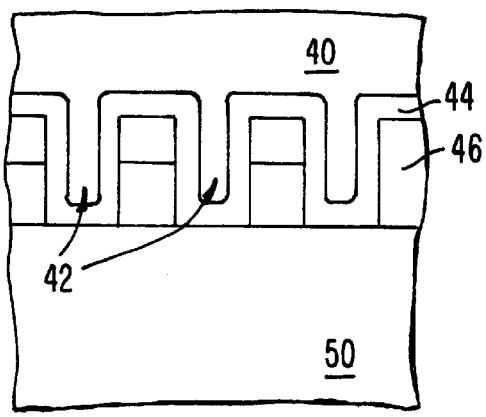   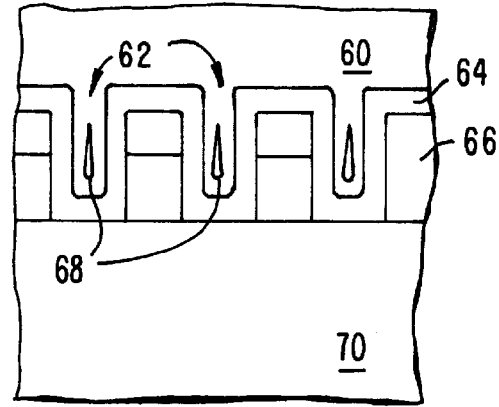
FIG. 2A.      FIG. 2B.

METHOD FOR DEPOSITING AND PLANARIZING FLUORINATED BPSG FILMS

BACKGROUND OF THE INVENTION

The present invention relates to the formation of a borophosphosilicate glass ("BPSG") layer during the fabrication of integrated circuits on semiconductor wafers. More particularly, the present invention relates to a method for improving the reflow characteristics of a BPSG film enabling the film to fill gaps having higher aspect ratios and smaller widths while meeting the thermal budget requirements of modern day manufacturing processes.

Borophosphosilicate glass ("BPSG") has found wide use in the semiconductor industry as a separation layer between the polysilicon gate/interconnect layer and the first metal layer of MOS transistors. Such a separation layer is often referred to as premetal dielectric (PMD) layer because it is deposited before any of the metal layers in a multilevel metal structure and is used to electrically isolate portions of the first deposited metal layer from the semiconductor substrate.

In addition to having a low dielectric constant, low stress and good adhesion properties, it is important for PMD layers to have good planarization and gap-fill characteristics. BPSG deposition methods have been developed to meet these characteristics and often include planarizing the layer by heating the layer above its reflow temperature so that it flows as a liquid. The reflow process enables the BPSG to better fill high-aspect ratio, small-width trenches and results in a flat upper surface upon cooling. The heating necessary to reflow a BPSG layer can be achieved using either a rapid thermal pulse (RTP) method or a conventional furnace in either a dry (e.g., $N_2$ or $O_2$) or wet (e.g., steam $H_2/O_2$) ambient. These processes are generally considered to be somewhat equivalent and thus interchangeable for many applications. If any particular benefits are attributable to one process over the others, however, persons of skill in the art generally believe that annealing a BPSG layer in a conventional furnace having a wet (steam) ambient provides better gap-fill properties than using RTP methods and that dry conventional furnace anneals are basically equivalent to RTP methods in terms of gap-fill characteristics.

Standard BPSG films are formed by introducing a phosphorus-containing source and a boron-containing source into a processing chamber along with the silicon-and oxygen-containing sources normally required to form a silicon oxide layer. Examples of phosphorus-containing sources include triethylphosphate (TEPO), triethylphosphite ($TEP_i$), trimethylphosphate (TMOP), trimethylphosphite ($TMP_i$), and similar compounds. Examples of boron-containing sources include trietbylborate (TEB), trimethylborate (TMB), and similar compounds.

As semiconductor design has advanced, the feature size of the semiconductor devices has dramatically decreased. Many integrated circuits (ICs) now have features, such as traces or trenches that are significantly less than a micron across. While the reduction in feature size has allowed higher device density, more complex circuits, lower operating power consumption, and lower cost, the smaller geometries have also given rise to new problems, or have resurrected problems that were once solved for larger geometries.

One example of a manufacturing challenge presented by submicron devices is the ability to completely fill a narrow trench in a void-free manner while keeping the thermal budget of the trench-filling process at a minimum. For example, in order to meet the manufacturing requirements of 0.18 micron geometry devices and below, a BPSG layer may be required to fill 0.1 micron wide gaps and narrower having an aspect ratio of up to 6:1. At the same time, these manufacturing requirements require that the thermal budget of the BPSG deposition and reflow step be kept to a minimum.

One method that manufacturers have developed in efforts to meet these and/or similar requirements is the addition of fluorine or similar halogen element to the BPSG film. Such fluorine-doped BPSG films are often referred to as "fluorinated-BPSG" or "FBPSG." Fluorine is believed to lower the viscosity of the BPSG film so that it reflows easier during the reflow step. In this manner, the addition of fluorine can be used to improve the gap-fill and planarization of BPSG layers when deposited and reflowed at a given temperature. Alternatively, the addition of fluorine can be used to reduce the reflow temperature of the BPSG film while retaining gap-fill and planarization characteristics of a BPSG film reflowed at a higher temperature. U.S. Pat. No. 5,633,211 illustrates one example of a method used to deposit a FBPSG layer.

SUMMARY OF THE INVENTION

The present invention provides a new and improved process for filling small-width, high-aspect ratio gaps with a BPSG layer. The present invention deposits a halogen-doped BPSG layer (a fluorinated-BPSG layer in preferred embodiments) over a small-width, high-aspect ratio gap that requires filling with a dielectric material and reflows the layer in a rapid thermal pulse (RTP) furnace. The present inventors have found that reflowing a fluorinated-BPSG layer in an RTP furnace provides unexpectedly superior results as compared to reflowing the layer in a conventional furnace using either a dry or wet anneal process.

The inventors believe that the superior results are due in part to the highly mobile nature of fluorine atoms present in a fluorinated-BPSG film. Standard, non-RTP BPSG reflow methods, typically heat the BPSG film above the film's reflow temperature for between 20–40 minutes or more depending on the temperature used in the reflow process and the required degree of planarization. The present inventors have found that the temperature of the reflow process and the physical nature of the layer beneath the FBPSG layer are important to the reflow characteristics of FBPSG layer when the layer is reflowed in a conventional furnace. More specifically, the present inventors have discovered that when the FBPSG layer is deposited over a PECVD TEOS silicon oxide layer (a silicon oxide layer deposited by a plasma CVD process using TEOS and oxygen precursor gases), the reflow characteristics of the FBPSG film are about the same as a similar BPSG film without fluorine. Similarly, when the FBPSG layer is deposited over a LP nitride (silicon nitride film deposited from a low pressure CVD process) layer and reflowed at a temperature of about 800° C. or higher, the reflow characteristics of the film are similar to those of a similar BPSG film without fluorine. In other words, in both of these cases, the addition of fluorine to the BPSG film does not significantly improve the reflow characteristics of the film.

The inventors discovered that FBPSG films did indeed, however, exhibit better reflow characteristics than BPSG films when deposited over denser underlying layers, such as LP nitride layers and reflowed in a conventional furnace at a relatively low anneal temperature (e.g., less than about 750° C.). It is theorized that the highly mobile fluorine atoms in the BPSG film migrate into the layers underlying the film. When the FBPSG layer is deposited over a relatively dense layer such as an LP nitride layer and reflowed at a temperature of around 750° C. or less, the underlying layer acts as a barrier that reduces the diffusion rate of fluorine into the layer. When the FBPSG layer is deposited over a PETEOS oxide layer, though, the fluorine atoms move with relative ease from the FBPSG layer into the oxide layer during the reflow process. The inventors believe that the excursion of fluorine atoms into the oxide layer in this manner happens within a relatively early stage of the anneal process thus depriving the FBPSG layer of fluorine atoms for a significant portion of the reflow process and preventing the fluorine from improving the viscosity and gap-fill properties of the layer.

According to the method of the present invention, an FBPSG layer is deposited over a substrate and reflowed using a rapid thermal pulse (RTP) method. Such an RTP method reflows the film in a minimal amount of time (e.g., 10–90 seconds depending on the temperature used to reflow the layer and the degree of planarization required among other factors). Thus, the fluorine atoms within the FBPSG layer do not have sufficient time to migrate from the layer even if the layer is deposited over a PETEOS oxide or similar layer.

This and other embodiments of the present invention along with many of its advantages and features are described in more detail in conjunction with the text below and attached figures.

BRIEF DESCRIPTION OF THE DRAWINGS

FIG. 1A if simplified cross-sectional view of a silicon substrate, which has an exemplary integrated circuit partially formed thereon, over which a BPSG layer deposited and planarized according to the method of the present invention may be formed;

FIG. 1B is a simplified cross-sectional view of the silicon substrate shown in FIG. 1A after the BPSG layer has been planarized;

FIG. 2A is a sketch of an SEM photo showing a BPSG layer 40 after the layer has been reflowed in accordance with embodiments of the present invention;

FIG. 2B is a sketch of an SEM photo showing a BPSG layer 60 that includes voids 68 after the layer has been reflowed using prior art reflow methods;

DESCRIPTION OF THE SPECIFIC EMBODIMENTS

Figure 3:
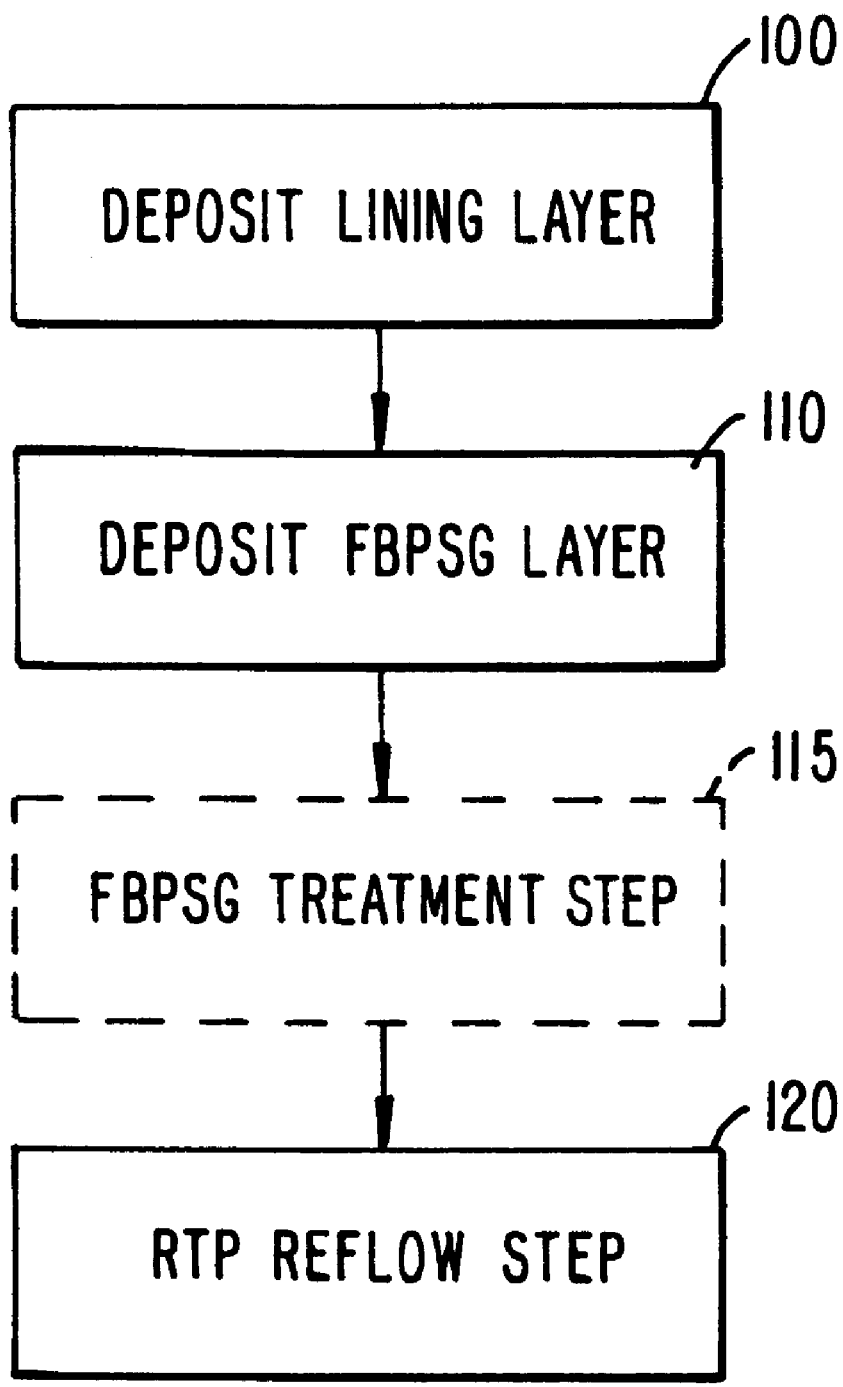
FIG. 3 is a flowchart illustrating the steps of an embodiment of the method of the present invention.

FIG. 1A is a simplified cross-sectional view of a silicon substrate 10 having an exemplary integrated circuit 12 partially formed thereon. As shown in FIG. 1A, integrated circuit 12 includes a plurality of raised structures 14, such as polycide conductive lines and polycide gate structures, and an insulation layer 16 deposited over the raised structures. Insulation layer 16 includes a lining layer 18 and a BPSG gap-fill layer 20. Lining layer 18 separates gap-fill layer 20 from the underlying substrate and raised features and helps prevent moisture and ionic contamination from penetrating into the substrate and raised features.

Lining layer 18 is typically an undoped silicon oxide layer or a silicon nitride layer. One common method of forming an undoped silicon oxide layer 18 is from a plasma enhanced CVD process that employs TEOS and oxygen as precursor gases. A common method of forming a silicon nitride layer 18 is from a low pressure CVD process that uses silane and nitrogen as precursor gases. FIG. 1A shows BPSG layer 20 prior to the planarization or reflow of the layer. Also shown in FIG. 1A are voids 22 that may form in BPSG layer during its deposition if the aspect ratio (ratio of the height to width) of a gap between any two adjacent raised structures 14 into which the BPSG layer is deposited is sufficiently high. As is common in the manufacture of actual integrated circuits, FIG. 1A shows voids 22 forming in high aspect ratio, narrow-width gaps 24 and not in low aspect ratio, wide-width gaps 26.

FIG. 1B shows integrated circuit 12 after BPSG layer 20 has been reflowed. As evident in the FIG., the reflow process results in the flattening or planarization of layer 20 and, ideally, the filling of voids 22. Whether or not voids 22 are completely filled as is shown in FIG. 1B depends on the temperature, length and type of reflow process used, the boron and phosphorus concentrations of the BPSG layer, whether or not BPSG layer 20 is further doped with a halogen element such as fluorine, and the shape of the voids among other factors. For example, as is known to those of skill in the art, the glass transition temperature (reflow temperature) of a given BPSG layer 20 depends in part on the boron and phosphorus dopant concentrations of the layer. Standard BPSG films typically have between a 2–6 weight percent (wt. %) boron concentration, a 2–9 wt. % phosphorus concentration and a combined dopant concentration (boron and phosphorus) of about 11 wt. % or less. Generally speaking, increasing the boron concentration of the BPSG layer reduces the reflow temperature of the layer. At boron concentration levels of higher than 6 wt. %, however, a given BPSG layer is likely to be susceptible to moisture and diffusion problems.

FIGS. 1A and 1B are generic structures and can represent embodiments of the present invention as well as embodiments of the prior art.

As described in the Background of the Invention section above, one known method of improving the reflow characteristics of layer 20, including the ability of the reflow process to eliminate any voids 22 formed in the film, is to incorporate a halogen element into the BPSG layer during the film deposition process. The most common halogen element to include in the BPSG layer is fluorine. Fluorine can be incorporated into a BPSG film by adding a fluorine-containing source gas such as vaporized TEFS to the BPSG process gas.

The present inventors have discovered, however, that the physical properties of lining layer 18 and the type of reflow process used to planarize BPSG layer 20 can greatly affect the reflow characteristics of a BPSG layer when the layer incorporates fluorine or another halogen element to improve its reflow characteristics. In discovering these previously unknown facts, the inventors performed numerous experiments with FBPSG films testing the limits of and trying to improve the gap-filling ability of the FBPSG films. In one of these sets of experiments, a 3×8 FBPSG layer (3 wt. % boron, 8 wt. % phosphorus) was deposited over an LP nitride underlying layer 18 and annealed at 800° C. for 30 minutes in a dry $N_2$ ambient the layer. The film included 0.7 wt. % fluorine.

FIG. 2A is a sketch of a SEM photo showing the 3×8 FBPSG layer 40 after the reflow process. As shown in FIG.

2A, the deposited FBPSG layer was able to fill narrow-width gaps 42 having aspect ratios of about 4:1 without the formation of voids. Also shown in FIG. 2A is LP nitride layer 44 deposited over raised structures 46 formed on a substrate 50.

The inventors discovered, however, that the same deposition process (3×8 FBPSG film) and reflow process (30 minute 800° C. anneal in an $N_2$ ambient) could not adequately fill the same size gap when the FBPSG layer was deposited over a PETEOS oxide layer. FIG. 2B is a sketch of a SEM photo showing the resulting structure. In FIG. 2B, voids 68 remained after the reflow step. Also shown in FIG. 2B is FBPSG layer 60, PETEOS oxide layer 64, narrow-width 4:1 aspect ratio gaps 62 and raised structures 66 formed on a substrate 70.

The inventors further discovered that the gap-fill capability of the FBPSG film shown in FIG. 2B was not significantly different than that of a 3×8 BPSG layer deposited without the addition of fluorine. That is, after the reflow process, a 3×8 BPSG layer deposited and reflowed in the same manner and over the same sized raised structures as the FBPSG films shown in FIGS. 2A and 2B (minus the fluorine) has voids similar to voids 68 shown in FIG. 2B.

In analyzing the above and other test results, the inventors were able to conclude that the gap-fill characteristics of an FBPSG layer depended at least in part on the type of layer the FBPSG film was deposited over when the layer was reflowed using a conventional furnace annealing process. The inventors then performed a series of experiments reflowing the layer using a rapid thermal pulse (RTP) method. As mentioned in the Background of the Invention section above, RTP and conventional furnace anneal processes are generally considered to be somewhat equivalent by those of skill in the art. If any particular benefits are attributed to one process over the other, however, persons of skill in the art generally believe that annealing a BPSG layer in a conventional furnace having a wet (steam) ambient provides better gap-fill properties than using RTP methods and that dry conventional furnace anneals are basically equivalent to RTP methods in terms of gap-fill characteristics. It is generally believed that wet furnace anneals are superior in this regard because the steam is able to penetrate the BPSG layer during the relatively lengthy (e.g., 20–40 minute) furnace anneal process and thereby improve the reflow of the layer. An RTP reflow process cannot achieve the same benefits from the use of steam because the process is not long enough for the steam to diffuse through the thickness of the film into the gaps and make a significant difference in the reflow of the film.

The present inventors discovered, however, much to their surprise that annealing an FBPSG layer deposited over a PETEOS silicon oxide layer with an RTP process resulted in a significant improvement in the gap-fill characteristics of the FBPSG layer. For example, when the 3×8 FBPSG layer deposited over a PETEOS oxide layer discussed above with respect to FIG. 2B was annealed at 950° C. for 20 seconds in an $N_2$ ambient using an RTP process, the layer was able to completely fill the gaps 62 without the formation of any voids 68 between the gaps. Furthermore, the degree of planarization of the layer was essentially the same as that of the layers reflowed using the longer, conventional anneal process the (30 minute, 800° C.).

While not being restricted by any particular theory of operation, the inventors believe that the unexpected superior results that were achieved using an RTP anneal process to reflow the FBPSG layer instead of a conventional furnace anneal are a result of the high mobility of fluorine within the layer. The inventors believe that in the experiments in which a FBPSG layer was deposited over a PETEOS silicon oxide layer, the fluorine from the FBPSG layer rapidly diffused from the layer into the PETEOS layer and into the substrate beneath the PETEOS layer. It is further believed that the diffusion of fluorine atoms in this manner likely occurs during the early stages of the anneal process, e.g., the first 5–10 minutes. Thus, for much of the anneal process the FBPSG layer is without the benefit of fluorine atoms that have been shown to increase the viscosity of the layer during the reflow process and hence improve the layers reflow characteristics. Deprived of this benefit for a significant portion of the reflow process, the reflow process is unable to fill high aspect ratio, narrow width gaps in a manner substantially free of voids that could otherwise be filled.

The LP nitride layer is significantly more dense (approximately 2.8–3.1 $g/cm^3$) than the PETEOS layer (approximately 2.2 $g/cm^3$). Thus, the inventors believe that when the FBPSG layer deposited over the LP nitride layer was annealed in a conventional furnace, the LP nitride layer acted as a diffusion barrier slowing the diffusion of fluorine atoms into the nitride layer and substrate.

Further tests indicated that the use of higher reflow temperatures during a conventional furnace anneal resulted in worse, not better, reflow characteristics of an FBPSG layer deposited over an LP nitride layer. This is contrary to what would normally be expected as, other factors being equal, higher reflow temperature generally result in better gap-fill and planarization characteristics. The inventors believe, however, that at higher reflow temperatures, the fluorine diffuses through the nitride layer quicker than at lower reflow temperatures. Thus, FBPSG layers reflowed at higher temperatures in a conventional furnace become fluorine deprived, and thereby loose the benefits fluorine imparts to the FBPSG film, sooner than those reflowed at lower temperatures.

FIG. 3 is a flowchart showing the method of the present invention. As shown in FIG. 3, the method includes depositing a fluorine- or other halogen-doped BPSG layer (step 110) then reflowing the layer using an RTP reflow step (Step 120). RTP reflow step 120 generally heats the layer to a temperature over 900° C. for between about 20–90 seconds, and can be done in commercially available RTP furnaces such as the Centura™ RTP manufactured by Applied Materials, assignee of the present invention. Such commercially available RTP furnaces generally allow rates of change of wafer temperature as high as ±50–100° C./sec. A more detailed description of one RTP furnace that can be used to reflow the FBPSG layer in step 120 is set forth in U.S. Pat. No. 5,155,336 entitled "Rapid Thermal Heating Apparatus and Method" issued to Gronet et al. The 5,155,336 patent is assigned to Applied Materials, the assignee of the present invention and is hereby incorporated by reference in its entirety.

The use of RTP reflow step 120 achieves film reflow in a rapid manner so that fluorine incorporated into the FBPSG layer does not have time to completely diffuse from the layer. Thus, the FBPSG layer gets the full benefit of fluorine incorporation. This, in turn, allows the RTP-reflowed FBPSG layer to achieve superior gap-fill results as compared to reflowing the FBPSG layer in a conventional furnace. The superior results may be noticeable in the filling of certain small-width, high aspect ratio gaps such as those shown in FIGS. 2A and 2B. In filling a gap of a given size, the process of the invention may fill the gap in a substantially void free manner as shown in FIG. 2A while reflowing the film in a conventional furnace may result in the presence of a void in the same gap as shown in FIG. 2B.

Prior to depositing the FBPSG layer in step 110, preferred embodiments of the method of the present invention include depositing a lining layer, such as an undoped silicon oxide or silicon nitride layer over the substrate (step 100). While it has been already discussed that the method of the present invention is particularly useful when the FBPSG layer deposited in step 110 is deposited over a silicon oxide lining layer, it can be useful when deposited over a silicon nitride layer. As an example, the present inventors have determined that in order to maximize the gap-fill properties of an FBPSG layer reflowed in a conventional furnace, the layer must be 1) deposited over a silicon nitride layer or similarly dense underlying layer and 2) be reflowed at a relatively low reflow temperature of about 750° C. or less. Using lower reflow temperatures results in either or both a longer reflow process or a film that is not fully planarized. The reflow characteristics of an FBPSG layer can benefit by the method of the present invention if the layer is deposited over a silicon oxide underlayer (or a underlying layer having diffusion characteristics, with respect to fluorine, similar to silicon oxide) or if the layer is deposited over a silicon nitride layer and requires reflow or planarization characteristics that could only be achieved by reflowing the layer at a relatively high temperature (e.g., above about 800° C.) in a conventional furnace.

Step 110 deposits a FBPSG film having between about 0.5 to 3.0 wt. % fluorine. Generally speaking, the more fluorine incorporated into the film, the better the film's reflow properties. Higher fluorine concentrations also result in, however, film stability and moisture resistance problems.

In preferred embodiments, FBPSG layer is deposited in a cold-wall CVD deposition chamber rather than hot-walled LPCVD chamber. One particular example of such a cold-wall CVD chamber is the Gigafill™ chamber manufactured by Applied Materials. A detailed description of such a chamber is set forth in U.S. Ser. No. 08/748,883 entitled "Systems and Methods for High Temperature Processing Semiconductor Wafers" issued to Zhao et al. The 08/748,883 application was filed on Nov. 13, 1996, and is assigned to Applied Materials, the assignee of the present invention and is hereby incorporated by reference in its entirety.

Deposition of the film in a cold-wall chamber, such as the Gigafill™ chamber, allows for improved wafer temperature uniformity (the wafer is heated directly on a pedestal), minimizes unwanted gas phase reactions (resulting in fewer particles) and allows the use of higher deposition pressures (greater than 10 torr). Such higher pressures allow for higher gas flow rates and more uniform gas flows, higher film deposition rates at lower deposition temperatures and better film quality.

In the currently preferred embodiment, the FBPSG layer is deposited from a process gas of TEOS, TEFS, ozone, TEB and TEPO using an SACVD process. As would be understood by a person of ordinary skill in the art, the actual flow rates and other processing conditions will vary depending on the type and volume of the deposition chamber used and the desired film properties. In one particularly preferred embodiment in which FBPSG layer is deposited in a Gigafill™ chamber outfitted for 8-inch wafers, deposition occurs at 200 Torr and 480° C. The process gas includes 12 wt. % $O_3$ (4000 sccm) and 6000 sccm of He acting as a carrier gas for 600 mgm of a mixture of 50% TEOS and 50% TEFS, 80 mgm TEB and 70 mgm TEPO. Each of the TEOS/TEFS, TEB and TEPO are vaporized in a liquid injection system and then mixed with the helium carrier gas.

The present inventors have found that the inclusion of both TEOS and TEFS into the process gas results in improved film deposition qualities. Higher TEOS flow rates generally result in improvements to the FBPSG film's deposition rate, etch rate, density and stability. Higher TEFS flow rates, on the other hand, generally improve the film's reflow characteristics and thus better gap-fill properties. A ratio of about 50/50 TEOS and TEFS is currently thought to be an ideal balance between the two as the change in film properties is not directly proportional to the mixing concentration.

In still further embodiments, the deposited FBPSG layer is subject to an optional treatment step 115 to improve the stability of the layer. Two different treatment steps 115 have been found to improve film stability. The main purpose of each is to prevent moisture absorption which can interact with the dopant and cause film instabilities. In the first, a USG or nitride cap layer is formed over the FBPSG layer. The cap layer can be deposited from either a thermal or plasma process, but should be relatively thin (e.g., about 60 Å) so that it does not adversely affect the reflow properties of the FBPSG layer. The second treatment subjects the deposited FBPSG film to a brief nitrogen ($N_2$) plasma in order to densify the film and form a very thin (approximately 20 Å) $SiO_xN_y$ film over the layer. In one specific embodiment, the $N_2$ plasma treatment forms a plasma from a 2000 sccm helium flow and a 500 sccm $N_2$ flow for 50 seconds at 1.5 torr and 400° C. The plasma is formed from by application of 700 Watts of RF energy at 450 KHz.

Figure 4A:
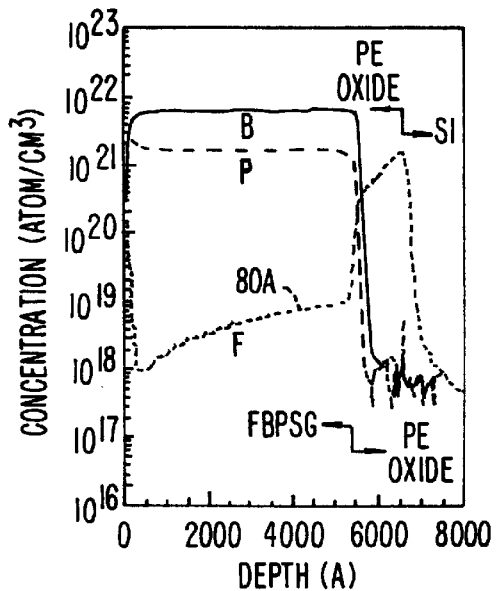
FIGS. 4A–4D are graphs that illustrate the mobility of fluorine atoms from an FBPSG film to various oxide and nitride underlayers when the FBPSG film is annealed in a conventional furnace.
Figure 4B:
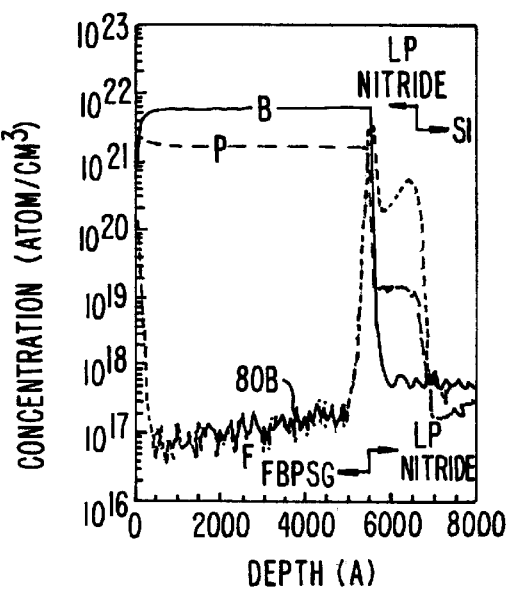
Figure 4C:
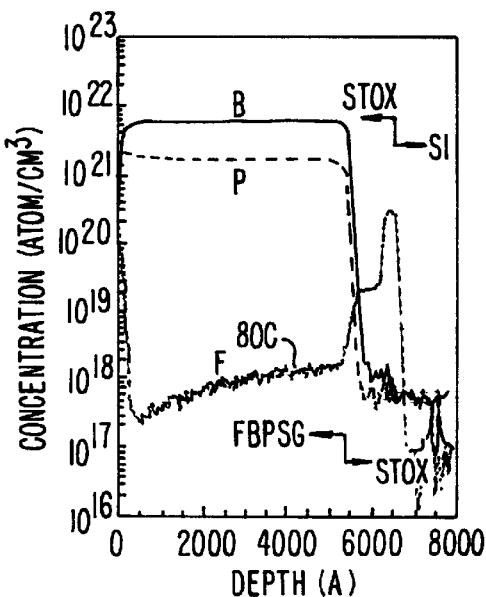
Figure 4D:
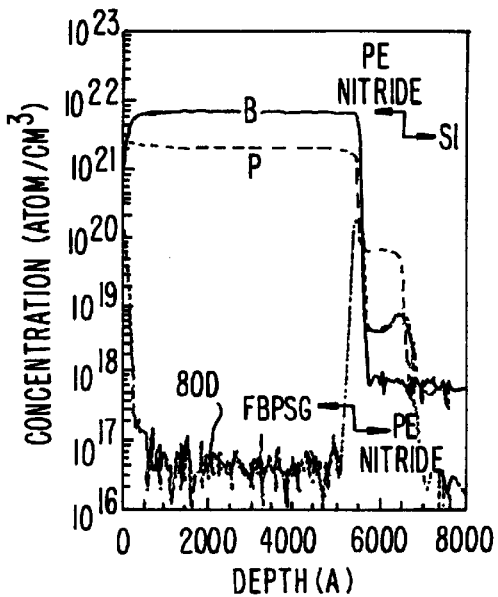

Further Experimental Results:

In order to test their theory of operation, the inventors performed a series of experiments that measure the fluorine concentration within the FBPSG layer before and after the anneal processes. FIGS. 4A–4D show the results of these experiments on FBPSG films annealed in a conventional furnace (MRL Horizontal Furnace). Specifically, FIG. 4A shows the concentration of fluorine remaining in an FBPSG layer deposited over a PE oxide layer after a 30 minute reflow step at 800° C. in a conventional furnace having an $N_2$ ambient. FIG. 4B shows the concentration of fluorine remaining in an FBPSG layer deposited over an LP nitride layer after the same anneal and FIGS. 4C and 4D show the concentration of fluorine remaining in an FBPSG layer deposited over steam oxide and PE nitride underlayers, respectively, after the same anneal.

Prior to the anneal process, the fluorine concentration in each film was on the order of $1 \times 10^{21}$ atoms/cm$^2$ and there was essentially no fluorine (background levels only) in any of the underlying layers. As evident in each of these figures, the concentration of fluorine remaining in the film after the reflow process, lines 80A, 80B, 80C and 80D, is significantly less than the initial concentration and fluorine migrated into the underlying layers. Also, each of the nitride underlying films exhibited a large concentration of fluorine at the interface between the film and the FBPSG layer. The inventors believe that this fluorine build-up is a result of the difficulty fluorine atoms have moving from the FBPSG layer to the nitride layer. No such build-up is present in the oxide underlying layers.

Figure 5A:
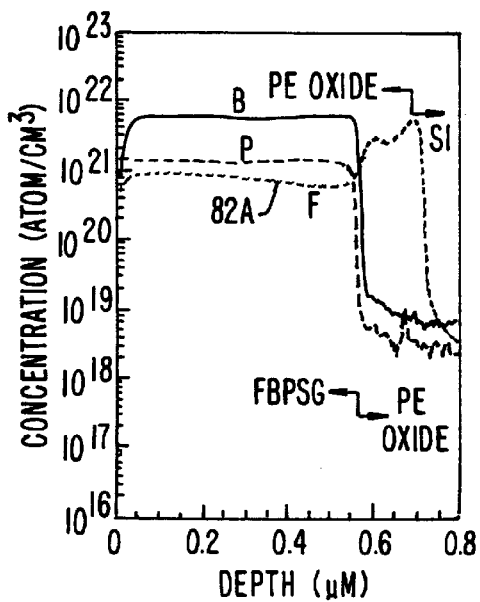
FIGS. 5A–5D are graphs that illustrate the retention of fluorine atoms within an FBPSG film after the FBPSG film is reflowed according to the method of the present invention.
Figure 5B:
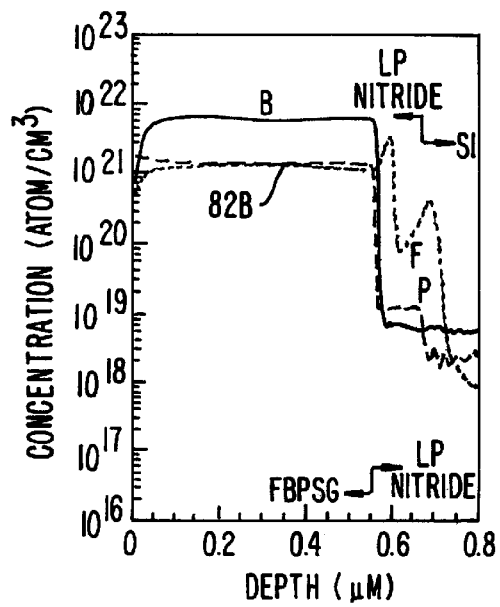
Figure 5C:
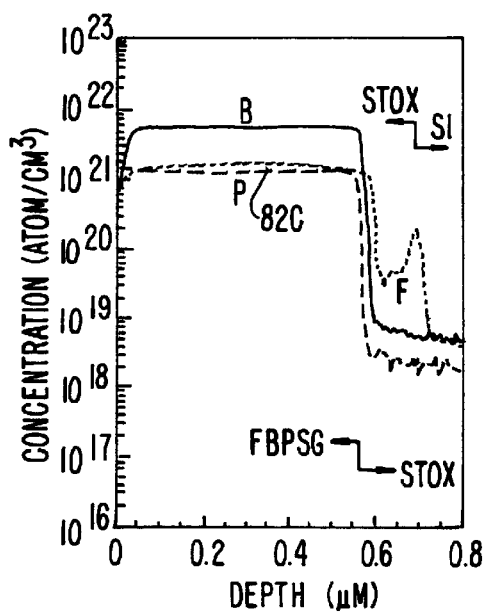
Figure 5D:
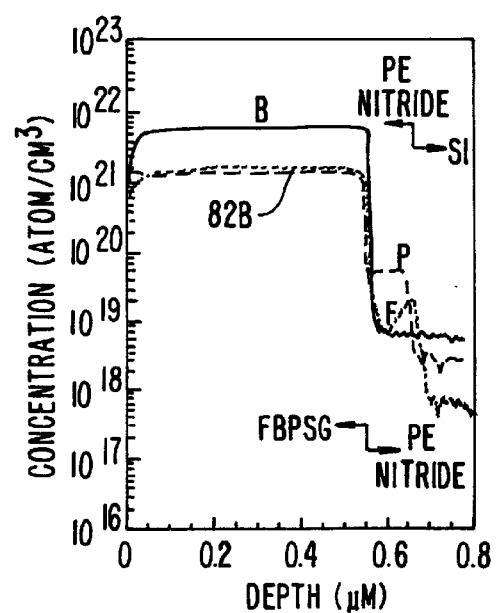

FIGS. 5A–5D show the results of these experiments on FBPSG films annealed in an RTP furnace (Centura™ RTP manufactured by Applied Materials) according to the method of the present invention. Specifically, FIG. 5A shows the concentration of fluorine remaining in an FBPSG layer deposited over a PE oxide layer after a 20 second RTP reflow step at 950° C. in an $N_2$ ambient. FIG. 5B shows the concentration of fluorine remaining in an FBPSG layer deposited over an LP nitride layer after the same RTP anneal and FIGS. 5C and 5D show the concentration of fluorine remaining in an FBPSG layer deposited over steam oxide and PE nitride underlayers, respectively, after the same RTP anneal.

The planarization of the FBPSG layers reflowed according to the method of FIGS. 5A–5D was essentially equivalent to the planarization of the FBPSG layers reflowed according to the method of FIGS. 4A–4D. Also, the initial fluorine concentrations of the films were essentially equivalent. Thus, prior to the anneal process, the fluorine concentration in each film was on the order of $1\times10^{21}$ atoms/cm$^2$ and there was essentially no fluorine (background levels only) in any of the underlying layers. As evident from FIGS. 5A–5D, the concentration of fluorine remaining in the FBPSG films after the RTP reflow process, lines 82A, 82B, 82C and 82D, is similar to the initial fluorine concentration in the film. Also, little to no fluorine migrated into the underlying layers.

In summary, the present inventors have found that the use of an RTP anneal process to reflow an FBPSG layer can result in significant gap-fill improvements as compared to reflowing the layer in a conventional furnace. Such improvements are particularly noticeable when the FBPSG layer is deposited over a layer having a density less than 2.5 g/cm$^3$, such as a PE oxide layer (density about 2.2 g/cm$^3$), as compared to when the FBPSG layer is deposited over a relatively dense underlying layer such as an LP nitride (approximate density between 2.8–3.1 g/cm$^3$) or a PE nitride layer (approximate density between 2.5–2.8 g/cm$^3$).

Having fully described several embodiments of the present invention, many other equivalent or alternative embodiments of the present invention will be apparent to those skilled in the art. These equivalents and alternatives are intended to be included within the scope of the present invention.

What is claimed is:

1. A method for depositing a layer over a substrate, said method comprising:
   depositing a halogen-doped borophosphosilicate glass (BPSG) layer over said substrate;
   processing said halogen-doped borophosphosilicate glass layer using a rapid thermal pulse furnace.

2. The method of claim 1 wherein said halogen-doped BPSG layer is a fluorinated-BPSG layer.

3. The method of claim 2 wherein said FBPSG layer is deposited over an undoped silicon oxide layer.

4. The method of claim 3 wherein said silicon oxide layer is deposited from a plasma of oxygen and TEOS.

5. The method of claim 3 wherein said silicon oxide layer and said FBPSG layer are deposited over a semiconductor substrate having transistors formed thereon.

6. The method of claim 5 wherein said FBPSG layer is deposited over gaps having an aspect ratio of 4:1 or higher and a width of about 1 micron or less and wherein said reflow step enables said FBPSG layer to fill said gaps without the presence of voids.

7. A method of claim 2 wherein said fluorinated-BPSG layer is deposited in a cold-wall CVD chamber.

8. The method of claim 7 wherein said fluorinated-BPSG layer is deposited from a process gas comprising TEOS and TEFS.

9. The method of claim 8 wherein said fluorinated-BPSG layer is deposited at a pressure greater than about 10 torr and a temperature between about 400–600° C.

10. The method of claim 2 wherein said FBPSG layer is deposited over a lining layer having a density less than about 2.5 g/cm$^3$.

11. A method for depositing a layer over a substrate, said method comprising:
    depositing a halogen-doped borophosphosilicate glass (BPSG) layer over said substrate;
    reflowing said halogen-doped borophosphosilicate glass layer using a rapid thermal pulse furnace.

12. A method for electrically isolating transistors formed on a silicon substrate from one or more metal lines deposited over said transistors, said method comprising:
    depositing a fluorine-doped borophosphosilicate glass (FBPSG) layer over said transistors;
    reflowing said FBPSG layer using a rapid thermal pulse furnace; and
    thereafter, depositing a metal layer over said FBPSG layer and patterning said metal layer to form said one or more metal lines.

13. The method of claim 11 wherein said transistors are fabricated using an integrated circuit design rule set for minimum feature sizes of 0.18 microns or less.

14. The method of claim 11 wherein said halogen doped BPSG layer is deposited over a silicon oxide layer.

15. The method of claim 11 wherein said halogen doped BPSG layer is deposited over a lining layer having a density less than about 2.5 g/cm$^3$.

16. The method of claim 12 wherein said halogen doped BPSG layer is deposited over a silicon oxide layer.

17. The method of claim 12 wherein said halogen doped BPSG layer is deposited over a lining layer having a density less than about 2.5 g/cm$^3$.

18. The method of claim 17 wherein said FBPSG layer is deposited over gaps having an aspect ratio of 4:1 or higher and a width of about 1 micron or less and wherein said reflow step enables said FBPSG layer to fill said gaps without the presence of voids.

* * * * *